United States Patent [19]
Maeda

[11] Patent Number: 5,880,629
[45] Date of Patent: Mar. 9, 1999

[54] DEMODULATOR HAVING VARIABLE GAIN AMPLIFIER AND A/D CONVERTER CONTROLLED BY SIGNAL LEVEL

[75] Inventor: Shigeki Maeda, Tokyo, Japan

[73] Assignee: NEC Corporation, Tokyo, Japan

[21] Appl. No.: 863,200

[22] Filed: May 27, 1997

[30] Foreign Application Priority Data

May 27, 1996 [JP] Japan ..................................... 8-131976

[51] Int. Cl.⁶ ............................ H03G 3/20; H04L 27/01; H04L 27/38
[52] U.S. Cl. .......................... 329/306; 375/233; 375/324; 375/345
[58] Field of Search .................... 329/304, 306; 375/233, 324, 345

[56] References Cited

U.S. PATENT DOCUMENTS

| | | | |
|---|---|---|---|
| 4,875,049 | 10/1989 | Yoshida ..................................... | 341/159 |
| 4,910,468 | 3/1990 | Ohtsuka et al. ......................... | 329/316 |
| 5,353,306 | 10/1994 | Yamamoto ................................ | 375/14 |
| 5,509,030 | 4/1996 | Mortensen ............................... | 375/232 |

FOREIGN PATENT DOCUMENTS 63-119331  5/1988  Japan .
 3-110930  5/1991  Japan .

OTHER PUBLICATIONS

Patent Abstracts of Japan, 62–231526, Dec. 10, 1987.

*Primary Examiner*—Siegfried H. Grimm
*Attorney, Agent, or Firm*—Foley & Lardner

[57] ABSTRACT

The demodulator of this invention is directed toward improving S/N ratio of the demodulator resulting from increase in the peak value of a received signal due to fading. The demodulator is composed of a roll-off filter (not shown), variable amplifier 16, multiplier 10, compressor 11, variable dynamic range analog/digital converter 12, transversal filter 13, expander 14, tap coefficient control circuit 15, and signal level detector 17. Signal level detector 17 detects the magnitude of waveform distortion from the output of tap coefficient control circuit 15 and controls the gain of variable amplifier 16 and the dynamic range of analog/digital converter 12, thereby reducing nonlinear distortion in multiplier 10 that is caused by increases in the peak value due to waveform distortion.

4 Claims, 5 Drawing Sheets

DEMODULATOR HAVING VARIABLE GAIN AMPLIFIER AND A/D CONVERTER CONTROLLED BY SIGNAL LEVEL

BACKGROUND OF THE INVENTION

1. Field of the Invention

The present invention relates to a demodulator, and particularly to improving equalization capabilities when waveform distortion occurs due to fading in a demodulator in a digital radio-communication system.

2. Description of the Related Art

In the development of digital radio-communication systems in recent years, the number of signal points in QAM have been advanced as a means of raising the utilization of radio frequencies. Because digital radio-communication systems are easily influenced by waveform distortion caused by fading, the advancement of the number of signal points in QAM has been accompanied by the development of adaptive equalizers that equalize waveform distortion. One example of such an adaptive equalizer that has been put to practical use is the adaptive time domain equalizer having transversal filter which adaptively controls the tap coefficient of a transversal filter.

One example of a demodulator that employs an all-digital adaptive equalizer (Japanese Patent Laid-open No. 110930/91: Automatic Equalizer) is shown in FIG. 1.

This prior-art demodulator is made up of a rolloff filter (not shown) for waveform shaping, multiplier 10, compressor 11, analog/digital (A/D) converter 12, transversal filter 13, variable expander 14, and tap coefficient control circuit 15. A controlled input signal 1 of an intermediate frequency band or a radio frequency band is multiplied by a regenerated carrier signal 3 at multiplier 10, and a demodulated baseband signal is outputted such that the output level of transversal filter 13 is a fixed level. The demodulated baseband signal is inputted to compressor 11 and compressed at a prescribed compression ratio, and then inputted to A/D converter 12. A rolloff filter is arranged either before or after the multiplier. The compression-ratio of compressor 11 is set so as not to exceed the range of the permissible input level (dynamic range) of the A/D converter even when waveform distortion occurs due to fading in the transmission line. This compression ratio is here defined as [post-compression amplitude/pre-compression amplitude]. If the output of compressor 11 is set to the full dynamic range of A/D converter 12 in a state in which there is no waveform distortion due to fading, the demodulator will be unable to perform correct waveform equalizing because, when fading does occur, a signal exceeding the dynamic range will be inputted to A/D converter 12 and nonlinear distortion will occur in A/D conversion.

The AID converted digital signal is next inputted to all-digital transversal filter 13, automatically equalized by a tap coefficient control signal from tap coefficient control circuit 15, and inputted to expander 14. Expander 14 multiplies the input signal by an expansion ratio equal to the inverse of the compression ratio in order to restore the original signal that was compressed by compressor 11, and outputs the result to terminal 2.

Another demodulator is provided with a compression/expansion ratio control circuit (not shown) that varies the compression ratio of compressor 11 and the expansion ratio of expander 14 based on a tap coefficient control signal, and such a demodulator is devised as a method of reducing quantization error during A/D conversion in a steady state, and preventing saturation of the A/D converter during A/D conversion in a fading state.

As described hereinabove, in an adaptive equalizer of the prior art, the input signal level of multiplier 10 must be set to a low value so as not to exceed the dynamic range when waveform distortion occurs as a result of fading. However, reducing the input signal level introduces the problem that the S/N ratio of the demodulator is also reduced.

SUMMARY OF THE INVENTION

The object of the present invention is to provide a demodulator that prevents saturation of signal level due to waveform distortion when fading occurs and that improves S/N ratio of circuits preceding the A/D converter in steady states in which fading does not occur.

The demodulator of the present invention includes variable gain amplifying means that amplifies a received modulated signal of an intermediate frequency band or a radio frequency band, multiplying means that takes as input the output of the amplifying means and a regenerated carrier signal, attenuating means that attenuates the multiplication output, variable dynamic range analog/digital converting means that converts output of the attenuating means to a digital signal, waveform equalizing means that takes as input the output of the analog/digital converting means, expanding means that digitally amplifies output of the waveform equalizing means, waveform equalizing control means that controls the waveform equalizing means, and signal level detecting means that detects the maximum level of the input signal of the multiplying means.

In addition, the variable gain amplifying means includes variable gain amplifying means that receives the detection result of the signal level detecting means, reduces the gain of the amplifying means when the output signal level of the amplifying means indicates a greater value than when in a steady state, and increases the gain of the amplifying means when the output signal level of the amplifying means indicates a smaller value than when in a steady state.

Further, the analog/digital converting means includes analog/digital converting means that receives the detection result of the signal level detecting means, reduces the dynamic range of the analog/digital converting means when the output signal level of the amplifying means indicates a greater value than when in a steady state, and increases the dynamic range of the analog/digital converting means when the output signal level of the amplifying means indicates a value smaller than when in a steady state.

Moreover, the signal level detecting means includes a signal level detecting means that operates based on a control signal of the waveform equalizing means.

The above and other objects, features, and advantages of the present invention will become apparent from the following description based on the accompanying drawings which illustrate an example of a preferred embodiment of the present invention.

DETAILED DESCRIPTION OF THE PREFERRED EMBODIMENTS

The demodulator of the present invention is provided with a signal level detector that detects the maximum level of the input signal of a multiplier, and is further provided with a variable amplifier that varies the signal level of multiplier input based on the detection results, and an A/D converter of variable standard conversion level. Because the peak level of the input signal of the multiplier is controlled so as to not exceed a fixed value, nonlinear distortion of the multiplier brought about by waveform distortion that occurs due to fading can be reduced in the demodulator of the present invention, and an improvement in S/N ratio of the demodulator can therefore be achieved.

Figure 1:
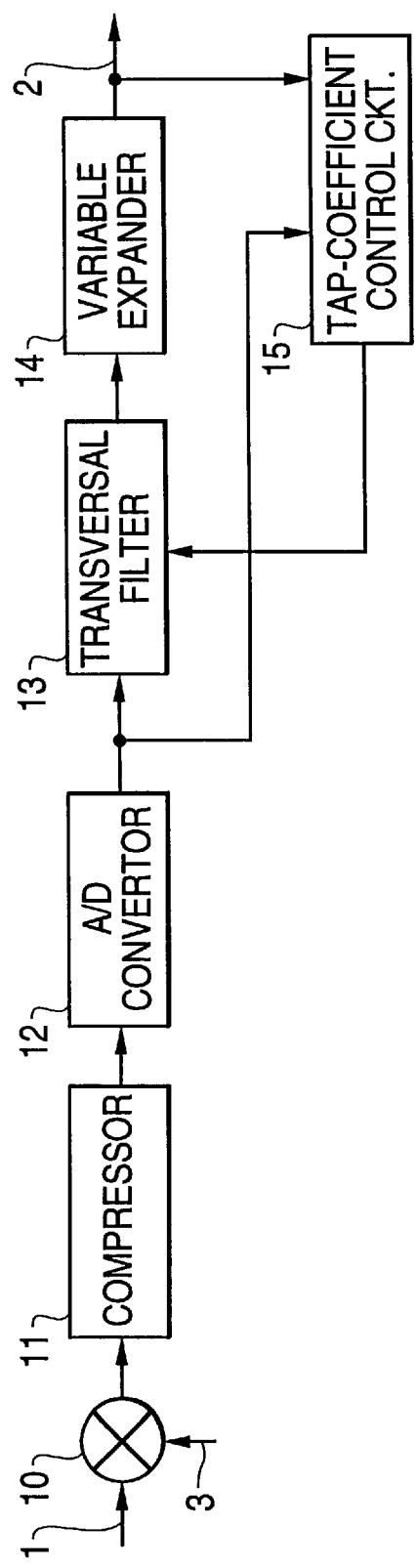
FIG. 1 is a block diagram showing an example of the prior art.
Figure 2:
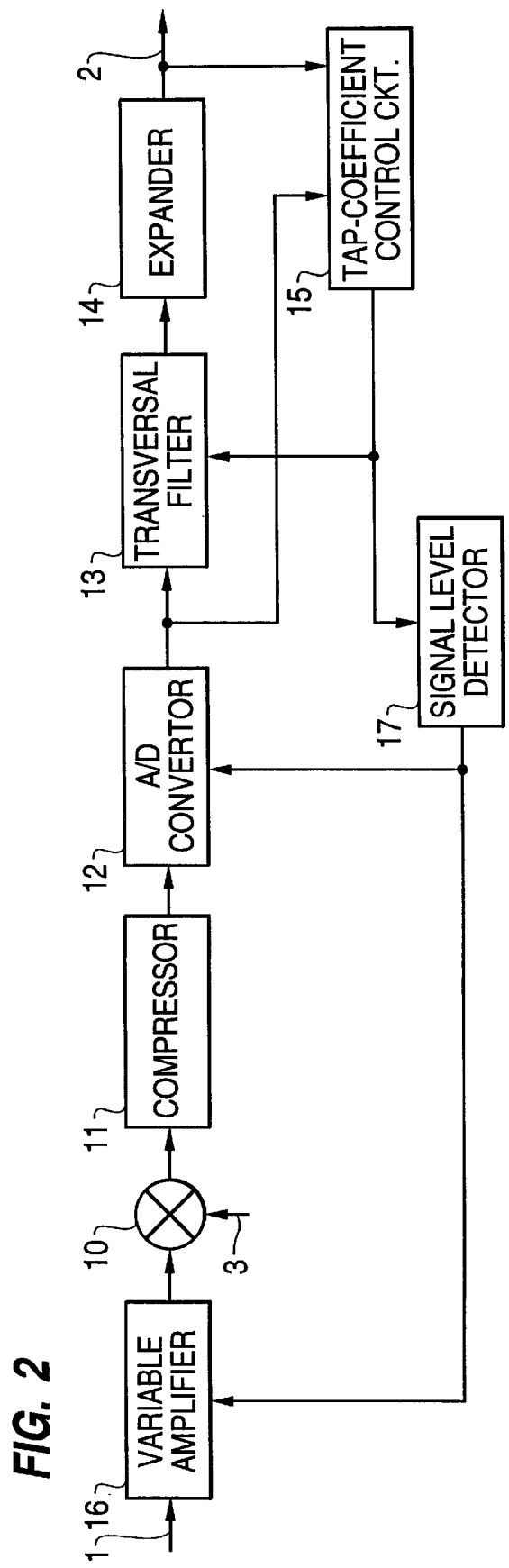
FIG. 2 is a block diagram showing the construction of an embodiment of the present invention.

An example of the present invention will next be described with reference to the accompanying figures. FIG. 2 shows an embodiment of the present invention. The demodulator of the present invention is composed of variable amplifier 16 of an intermediate frequency band or a radio-communication frequency band, multiplier 10, compressor 11, analog/digital (A/D) converter 12, transversal filter 13, expander 14, tap coefficient control circuit 15, and signal level detector 17.

Regarding the operation of the demodulator of the present invention, demodulator input signal 1 of an intermediate frequency band or a radio-communication frequency band inputted to variable amplifier 16 is controlled such that the output of transversal filter 13 is maintained at a fixed level, amplified at variable amplifier 16, and multiplied by regenerated carrier signal 3 at multiplier 10 to become a demodulated baseband signal. The gain of variable amplifier 16 is set such that the level diagram from the input section of variable amplifier 16 and up to the input section of A/D converter 12 is constantly maintained at an appropriate level. The demodulated baseband signal is inputted to compressor 11, compressed at a prescribed compression ratio, and then inputted to A/D converter 12.

The A/D converted digital signal is inputted to all-digital transversal filter 13 and tap coefficient control circuit 15. Tap coefficient control circuit 15 controls all-digital transversal filter 13 based on the output signal of A/D converter 12 and demodulator output signal 2.

Next, the A/D converted digital signal inputted to all-digital transversal filter 13 is automatically equalized by the tap coefficient control signal from tap coefficient control circuit 15 and inputted to expander 14. Expander 14 multiplies the input signal by an expansion rate equal to the inverse of the compression ratio in order to restore the original signal that has undergone compression in compressor 11, and outputs the result to terminal 2.

Signal level detector 17 detects the degree of waveform distortion based on the output of tap coefficient control circuit 15 and controls the amplification ratio of variable amplifier 16 such that the input signal level of multiplier 10 is maintained at an appropriate level. Signal level detector 17 also controls the standard voltage of A/D converter 12 and maintains the A/D conversion output at an appropriate level.

Figure 3:
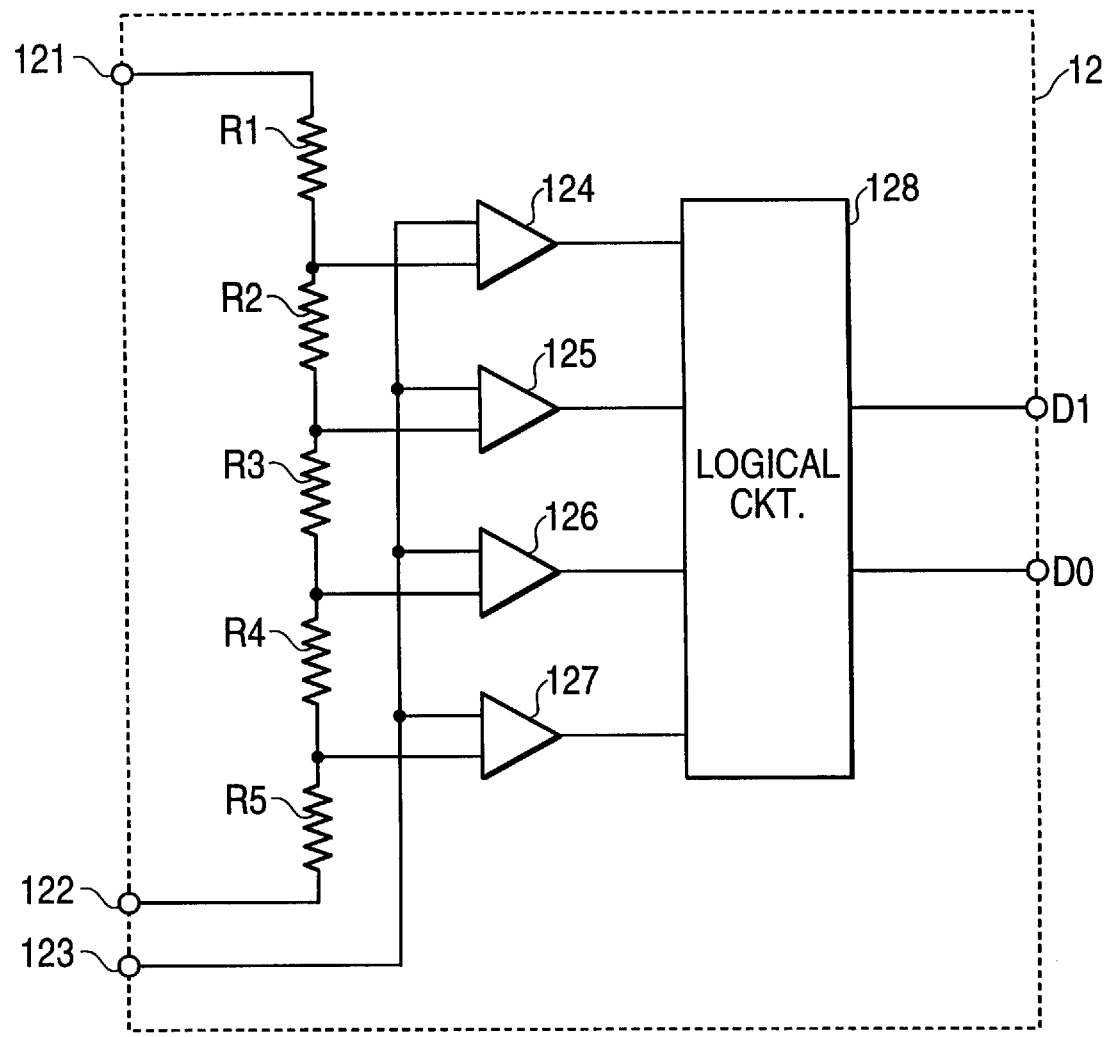
FIG. 3 shows one example of an A/D converter used in the present invention.

FIG. 3 shows one example of an A/D converter employed here, this case being a 2-bit A/D converter. Standard voltages inputted from first and second standard voltage input terminals 121 and 122 are voltage-divided by resistors R1 to R5 and supplied to comparators 124 to 127 as standard voltages. Comparators 124 to 127 compare the inputted standard voltages with the voltage of a signal inputted from signal input terminal 123, and output the comparison results to logic circuit 128. Logic circuit 128 logically converts the output of each comparator and outputs the results as digital signals.

If the standard voltage inputted to standard voltage input terminal 122 is $V_{INMIN}$, the standard voltage inputted to standard voltage input terminal 121 is $V_{INMAX}$, and the voltage impressed to input signal terminal 123 is $V_{IN}$, A/D converter 12 outputs (D1, D0)=(0, 0) as the output digital signal if $V_{IN}$ is less than $(V_{INMAX}-V_{INMIN})/5 \times 1 + V_{INMIN}$;

outputs (D1, D0)=(0, 1) if $V_{IN}$ ranges between $(V_{INMAX}-V_{INMIN})/5 \times 1 + V_{INMIN}$ and $(V_{INMAX}-V_{INMIN})/5 \times 2 + V_{INMIN}$;

outputs (D1, D0)=(1, 0) if $V_{IN}$ ranges between $(V_{INMAX}-V_{INMIN})/5 \times 2 + V_{INMIN}$ and $(V_{INMAX}-V_{INMIN})/5 \times 3 + V_{INMIN}$;

and outputs (D1, D0)=(1, 1) if $V_{IN}$ ranges between $(V_{INMAX}-V_{INMIN})/5 \times 3 + V_{INMIN}$ and $(V_{INMAX}-V_{INMIN})/5 \times 4 + V_{INMIN}$.

The output digital signal can vary the relation between the voltage impressed to the signal input terminal 123 and the output digital signal by varying the standard voltages.

Figure 4:
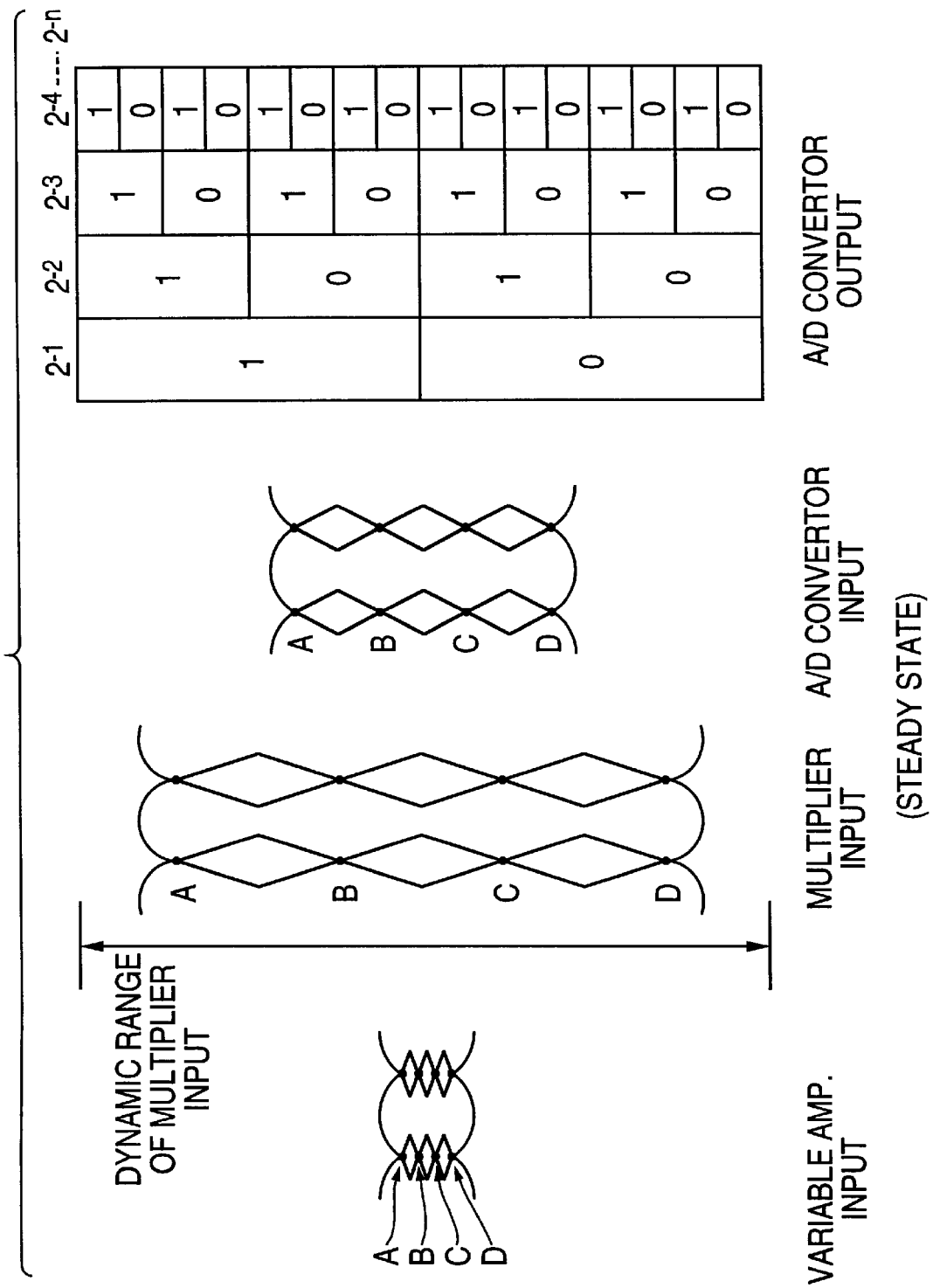
FIG. 4 shows the level diagram of the demodulator of the present invention when in a steady state.
Figure 5:
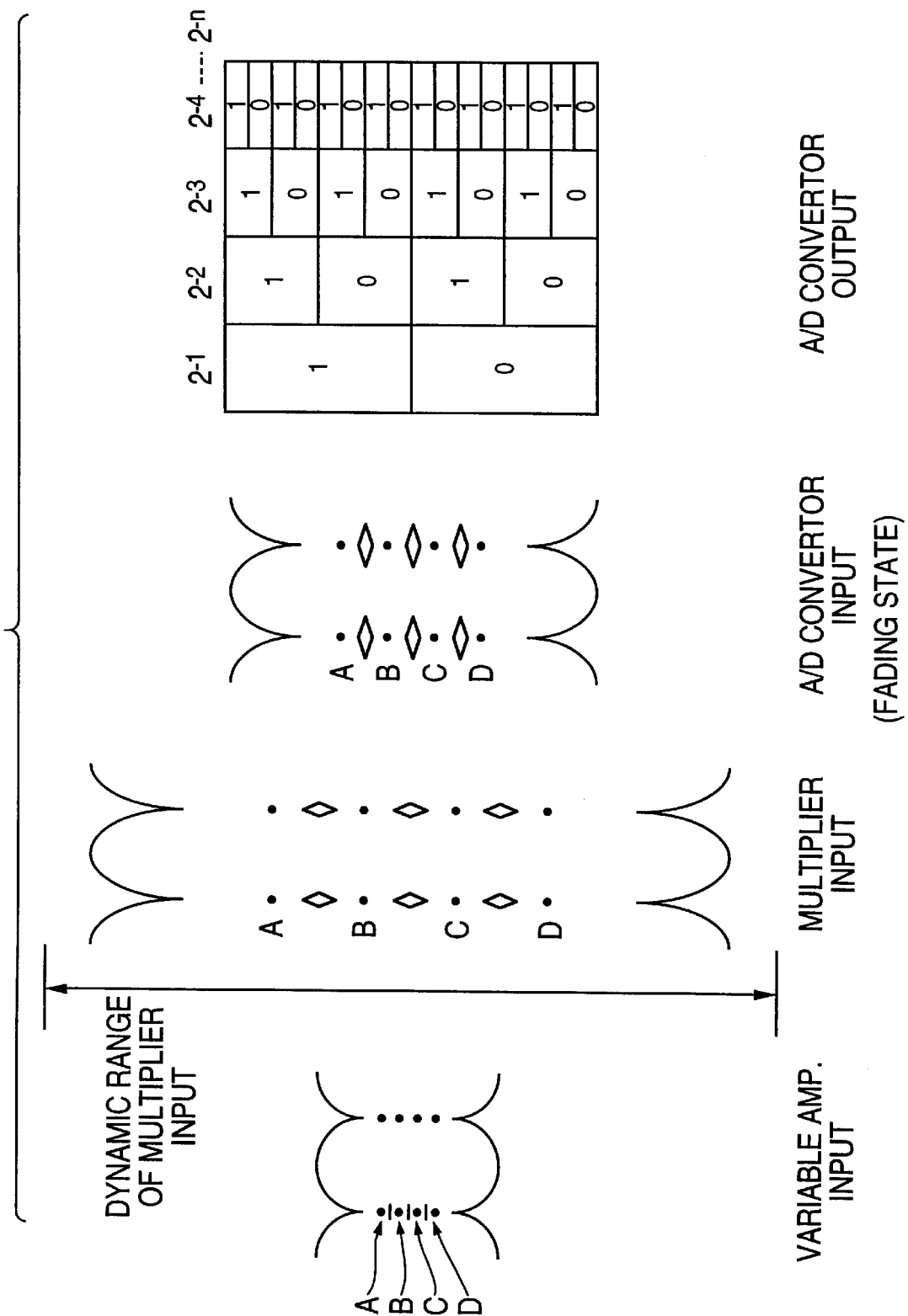
FIG. 5 shows a level diagram of the demodulator of the present invention when fading occurs.

FIG. 4 shows in eye pattern (eye diagram) format the level diagram of each section at steady state for a four-level baseband signal. The four-level baseband signal is used as the baseband signal of 16 quadrature amplitude modulation (16 QAM). In the figure, points A to D indicate the signal levels of the original signal points. The original signal points correspond to signal levels that should be received when signals transmitted at the transmitting side are not affected by waveform distortion due to, for example, fading. In other words, the signal levels correspond to points of convergence in an eye pattern (eye diagram) of ideal received signals. The level of demodulator input signal 1 is controlled such that the output of transversal filter 13 is maintained at a fixed level. In other words, the level of demodulator input signal 1 is set to a level such that the output of transversal filter 13 is $(2^{-1}, 2^{-2}, 2^{-3})=(1, 0, 1)$ with respect to signal level A, (1, 0, 0) with respect to signal level B, (0, 1, 1) with respect to signal level C, and (0, 1, 0) with respect to signal level D. The input level of multiplier 10 must be as large as possible to minimize the influence of background noise. However, since raising the input level of multiplier 10 to too high a level results in degradation of the error rate due to nonlinear distortion, the input level of multiplier 10 is set to a predetermined standard value which is the maximum within a range that maintains the desired linearity, i.e., within the input dynamic range of multiplier 10. In the non-distorted example shown in FIG. 4, the gain of variable amplifier 16 is set to about 10 times, as shown in the figure. Compressor 11 compresses the input signal to ½ and outputs to A/D converter 12. As described hereinabove, the standard voltage of A/D converter 12 is set such that the output of transversal filter 13 is $(2^{-1}, 2^{-2}, 2^{-3})=(1, 0, 1)$ with respect to signal level A, (1, 0, 0) with respect to signal level B, (0, 1, 1) with respect to signal level C, and (0, 1, 0) with respect to signal level D. In an ideal non-distorted state, the input and output of transversal filter 13 are identical, and the output of A/D converter 12 therefore is identical to the output of transversal filter 13. If waveform distortion occurs due to fading, the open portions of the eye pattern contract as shown in FIG. 5, and the input signal of variable amplifier 16 is controlled to maintain the output of transversal filter 13 at a constant, resulting in increased maximum amplitude. In other words, the signal points of the variable amplifier input in FIG. 4 and FIG. 5 are not altered from the signal levels of points A to D. The amount of waveform distortion is detected at tap coefficient control circuit 15, and the gain of the variable amplifier 16 is reduced when waveform distortion is great (in the example in FIG. 5, the gain is approximately 5 times) and the maximum amplitude of the signal inputted to multiplier 10 is suppressed to the permissible value or less. At the same time, the interterminal voltage between the first and second standard voltage input terminals 121 and 122 of A/D converter 12 is lowered in equal proportion to the reduction of gain (in the example of FIG. 5, ½ that of the example of FIG. 4). Accordingly, as explained in FIG. 3, the outputs of A/D converter 12 and transversal filter 13 for signal levels A to D are (1, 0, 1), (1, 0, 0), (0, 1, 1), and (0, 1, 0), respectively, which is equivalent to the outputs for the example in FIG. 4.

In the demodulator of the present invention, the peak level of the input signal to multiplier 10 is controlled so as to remain constantly at or below a fixed value, and as a result, this demodulator has the effect of reducing non-linear distortion of the multiplier 10 brought about by waveform distortion caused by fading.

It is to be understood, however, that although the characteristics and advantages of the present invention have been set forth in the foregoing description, the disclosure is illustrative only, and changes may be made in the arrangement of the parts within the scope of the appended claims.

What is claimed is:

1. A demodulator comprising:

variable gain amplifying means that amplifies a received modulated signal of an intermediate frequency band or a radio frequency band;

multiplying means that takes as input the output of said amplifying means and a regenerated carrier signal;

attenuating means that attenuates the output of said multiplying means;

variable dynamic range analog/digital converting means that converts output of said attenuating means to a digital signal;

waveform equalizing means that takes as input the output of said analog/digital converting means;

expanding means that digitally amplifies output of said waveform equalizing means;

waveform equalizing control means that controls said waveform equalizing means; and signal level detecting means that detects the maximum level of the input signal of said multiplying means.

2. A demodulator according to claim 1 wherein said variable gain amplifying means comprises variable gain amplifying means that receives detection results of said signal level detecting means, reduces gain of said amplifying means when the output signal level of said amplifying means indicates a greater value than when in a steady state, and increases gain of said amplifying means when the output signal level of said amplifying means indicates a smaller value than when in a steady state.

3. A demodulator according to claim 1 wherein said analog/digital converting means comprises analog/digital converting means that receives detection results of said signal level detecting means, reduces the dynamic range of said analog/digital converting means when the output signal level of said amplifying means indicates a greater value than when in a steady state, and increases the dynamic range of said analog/digital converting means when the output signal level of said amplifying means indicates a value smaller than when in a steady state.

4. A demodulator according to claim 1 wherein said signal level detecting means comprises a signal level detecting means that operates based on control signals of said waveform equalizing means.

* * * * *